United States Patent

Saeki

(10) Patent No.: US 6,784,482 B2
(45) Date of Patent: Aug. 31, 2004

(54) NONVOLATILE SEMICONDUCTOR MEMORY DEVICE COMPRISING HIGH CONCENTRATION DIFFUSED REGION

(75) Inventor: Katsutoshi Saeki, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/361,601

(22) Filed: Feb. 11, 2003

(65) Prior Publication Data

US 2004/0021167 A1 Feb. 5, 2004

(30) Foreign Application Priority Data

Jul. 30, 2002  (JP) ........................................ 2002-220571

(51) Int. Cl.⁷ .............................................. H01L 29/72
(52) U.S. Cl. ........................ 257/314; 257/315; 257/321
(58) Field of Search ................................ 257/314, 315, 257/321

(56) References Cited

U.S. PATENT DOCUMENTS 5,963,480 A  * 10/1999  Harari ........................ 257/314

FOREIGN PATENT DOCUMENTS

JP      2001-144189       5/2001

* cited by examiner

*Primary Examiner*—Edward Wojciechowicz
(74) *Attorney, Agent, or Firm*—Volentine Francos, PLLC

(57) ABSTRACT

The nonvolatile semiconductor memory device includes a first conductivity-type semiconductor substrate where an active region is created, a floating gate which is formed on the first conductivity-type semiconductor substrate, and a control gate which is formed on the floating gate. A first conductivity-type high concentration diffused region is formed in the non-overlapping region of the floating gate in the active region.

10 Claims, 7 Drawing Sheets

NONVOLATILE SEMICONDUCTOR MEMORY DEVICE COMPRISING HIGH CONCENTRATION DIFFUSED REGION

BACKGROUND OF THE INVENTION

1. Field of the Invention

The present invention relates to a nonvolatile semiconductor memory device comprising a high concentration diffused region.

2. Description of Related Art

As a nonvolatile semiconductor memory device constituting such memory cells as ROM (Read Only Memory), a device with a configuration including MOSFET (Metal Oxide Semiconductor Field Effect Transistor), which is comprised of a normal gate electrode (generally called a control gate), and a floating gate, which is electrically insulated from its surroundings, has been known.

Such a nonvolatile semiconductor memory device has an active region in the memory cell region thereof. In the memory device, a floating gate (electrode) and a control gate are formed so as to overlap via an insulation film, in a direction perpendicular to the channel direction of a channel region, which is created between the source region and the drain region, crossing the active region. In an ordinary state, the floating gate is formed overlapping with the active region, so the nonvolatile memory device is read normally.

However if the active region and the floating gate are misaligned in the channel direction for any reason during manufacture, a part of the active region which does not overlap with the floating gate, that is a non-overlapping region, exists.

If such an non-overlapping region exists, the data of the memory cells, including the nonvolatile semiconductor memory device, may not be read, and the normal operation of the nonvolatile semiconductor memory device cannot be expected.

SUMMARY OF THE INVENTION

It is an object of the present invention to provide a nonvolatile semiconductor memory device which operates normally, even if there is a region where the floating gate does not overlap in the active region, and a manufacturing method thereof.

To achieve the above mentioned objects, the nonvolatile semiconductor memory device of this invention comprises a first conductivity-type semiconductor substrate where an active region is created, a floating gate which is formed on the first conductivity-type semiconductor substrate, and a control gate which is formed on the floating gate. This nonvolatile semiconductor memory device has a first conductivity-type high concentration diffused region in a non-overlapping region with the floating gate in the active region.

Just like the above mentioned example, when data on the nonvolatile semiconductor memory device of this invention is read, the threshold voltage is high when the nonvolatile semiconductor memory device is in the "0" state, and the threshold voltage is low when the nonvolatile semiconductor memory device is in the "1" state. In other words, according to the nonvolatile semiconductor memory device of the invention, the threshold voltage in the first conductivity-type high concentration diffused region is higher than the threshold voltage of the region outside the first conductivity-type high concentration diffused region in "0" state. Therefore when data is read, the threshold voltage of the nonvolatile semiconductor memory device is determined by the threshold voltage in a region other than the non-overlapping region, regardless the threshold voltage in the first conductivity-type high concentration diffused region of the nonvolatile semiconductor memory device, that is the non-overlapping region of the floating gate. As a result, the nonvolatile semiconductor memory device of this invention operates normally even when a non-overlapping region of the floating gate exists in the active region due to misalignment during patterning of a floating gate, for example.

BRIEF DESCRIPTION OF THE DRAWINGS

The foregoings and other objects, features and advantages of the present invention will be better understood from the following description taken in connection with the accompanying drawings, in which.

DESCRIPTION OF THE PREFERRED EMBODIMENTS

Embodiments of the invention will now be described with reference to the accompanying drawings. Each drawing to be used in the descriptions herein below is shown merely to sufficiently assist in understanding the present invention, and therefore the present invention shall not be limited by the illustrated examples. In each drawing used for a description, like composing elements are denoted with the same numerals, where redundant description may be omitted.

Prior to descriptions on the structure of the nonvolatile semiconductor memory device of the invention, a semiconductor device structure, to be compared with the structure of the memory device of the invention, will be described first.

This description on the structure to be compared with will assist in understanding the structure of the memory device of the invention to be described herein below.

Figure 1A:
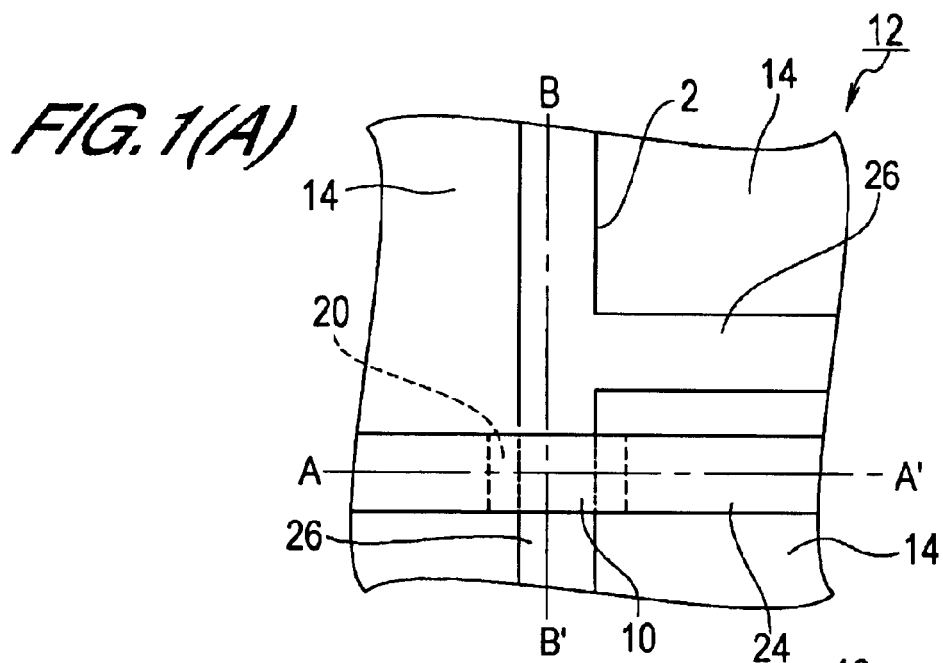
FIG. 1(A) is a plan view depicting the configuration of the memory cell region of the nonvolatile semiconductor memory device.
Figure 1B:
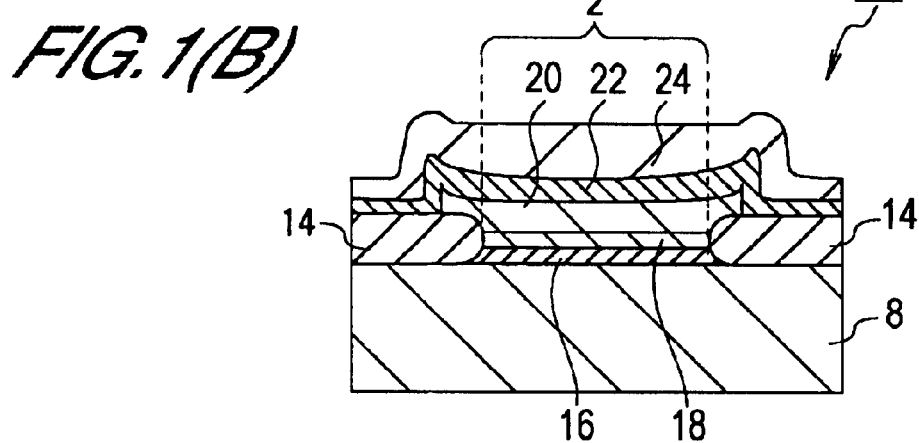
FIG. 1(B) and FIG. 1(C) are cross-sectional views depicting the cutting planes for explaining the configuration of the nonvolatile semiconductor memory device.
Figure 1C:
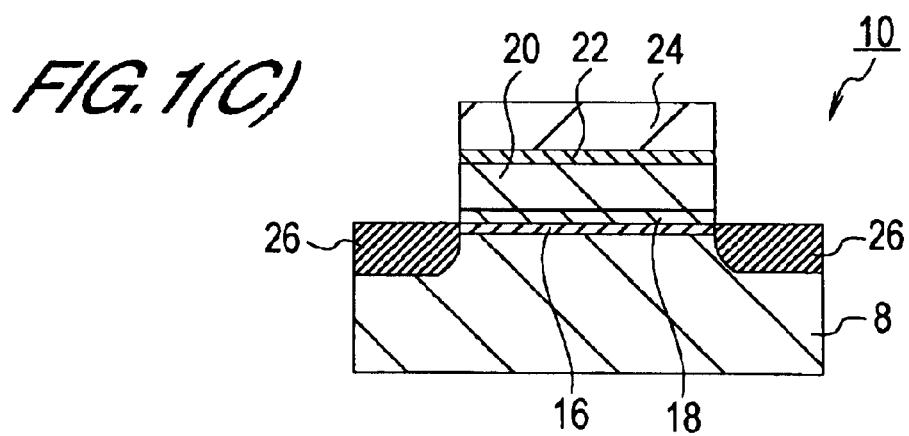

The configuration of the nonvolatile semiconductor memory device is shown in FIG. 1(A), FIG. 1(B) and FIG. 1(C). The nonvolatile semiconductor memory device 10 shown in FIG. 1(A), FIG. 1(B) and FIG. 1(C) has the configuration of an n-channel type MOSFET. The FIG. 1(A) is a plan view depicting a part of the memory cell region 12 of the ROM, for example, including the nonvolatile semiconductor memory device 10, viewed from the top, where the positional relationship of a part of the composing elements of the nonvolatile semiconductor memory device 10 is shown. FIG. 1(B) is a cross-sectional view depicting the cutting plane along the A–A' line in FIG. 1(A), and FIG. 1(C) is a cross-sectional view depicting the cutting plane along the B–B' line in FIG. 1(A).

FIG. 1(A) shows the active region 2, which is formed branching into a T-shape in the memory cell region 12. This active region 2 is a part of the substrate, and in this active region 2, an n-type high concentration diffused layer 26 is formed. This n-type high concentration diffused layer 26 becomes the main electrode region in the nonvolatile semiconductor memory device 10, that is, the source region and the drain region.

FIG. 1(A) also shows the floating gate 20 and the control gate 24, which are formed in the nonvolatile semiconductor memory device 10. In FIG. 1 (A), the band-shaped floating gate 20 and the control gate 24 stretch into the active region 2 in a direction perpendicular to the direction where the active region 2 stretches. The floating gate 20 is formed so as to extend over to the active region 2, that is to include a part of a region other than the active region 2. In FIG. 1(A), the control gate 24 stretches from a region, the same as the region where the floating gate 20 is disposed, to a region other than the active region 2. In the region where the floating gate 20 and the active region 2 are perpendicular to each other, the n-type high concentration diffused layer 26 is not formed. The region where the floating gate 20 and the control gate 24 overlap with the active region 2 becomes the device region of the nonvolatile semiconductor memory device 10. This device region will be described with reference to FIG. 1(B) and FIG. 1(C) respectively.

According to the configuration example of the nonvolatile semiconductor memory device 10 shown in FIG. 1(B), the field insulation film 14, which separates the active region 2 from the other region of the silicon (Si) substrate 8, is formed on the p-type silicon (Si) substrate 8. In the active region 2, the p-type diffused region 16, where a p-type channel ion has been implanted, is formed on the p-type Si substrate 8. The gate insulation film 18 is formed on the p-type Si substrate 8. The floating gate 20 is formed on the gate insulation film 18. And the control gate 24 is formed on the floating gate 20 sandwiching the IPO (Inter Poly Oxide) film 22. The IPO film 22 and the control gate 24 stretch over from the active region 2 to a region other than the active region 2 on the floating gate 20.

FIG. 1(C) is a cross-sectional view depicting the cutting plane of the active region 2 in the nonvolatile semiconductor memory device 10. In the p-type Si substrate 8 of the nonvolatile semiconductor memory device 10, the source region and the drain region, which are formed by the n-type high concentration diffused layer 26, are formed, and the p-type diffused region 16 is formed between this source region and drain region, which are n-type high concentration diffused layers 26.

Now an example of data erasing and an example of data writing of the nonvolatile semiconductor memory device 10, having the configuration described with reference to FIG. 1(A), FIG. 1(B) and FIG. 1(C), will be described. Here data erasing means setting the nonvolatile semiconductor memory device 10 to "0" state, in other words, setting the threshold voltage of the nonvolatile semiconductor memory device 10 to a high state during data reading. Data writing means setting the nonvolatile semiconductor memory device 10 to "1" state, in other words, setting the threshold voltage of the nonvolatile semiconductor memory device 10 to a low state during data reading.

The above mentioned description is an example, and whether "high state" or "low state" of the threshold voltage is set to "write" or "erase" depends on the design of the device user.

In this example, the data of the nonvolatile semiconductor memory device 10 is erased by applying high voltage to the control gate 24 and to the n-type high concentration diffused layer 26 of the drain region. At this time, the hot electrons generated around the drain region of the channel formed between the n-type high concentration diffused layers 26 of the drain region and the source region flow into the floating gate 20. As a result, when data is read from the ROM, comprised of memory cells including the nonvolatile semiconductor memory device 10, the threshold voltage Vt of the nonvolatile semiconductor memory device 10 is set to high state.

When data is written to the nonvolatile semiconductor memory device 10, electrons, which flowed into the floating gate 20 according to the above mentioned data erasing procedure, are emitted from the floating gate 20 by irradiating ultraviolet onto the nonvolatile semiconductor memory device 10 from the outside. As a result, when data is read from the ROM, comprised of memory cells including the nonvolatile semiconductor memory device 10, the threshold voltage Vt in the nonvolatile semiconductor memory device 10 is set to low state.

(1) Configuration Example of Nonvolatile Semiconductor Memory Device

A configuration example of the nonvolatile semiconductor memory device 100 of the present invention will now be described with reference to FIG. 2(A) and FIG. 2(B). The nonvolatile semiconductor memory device 100 shown in FIG. 2(A) and FIG. 2(B) has the configuration of an n-channel type MOSFET.

Figure 2A:
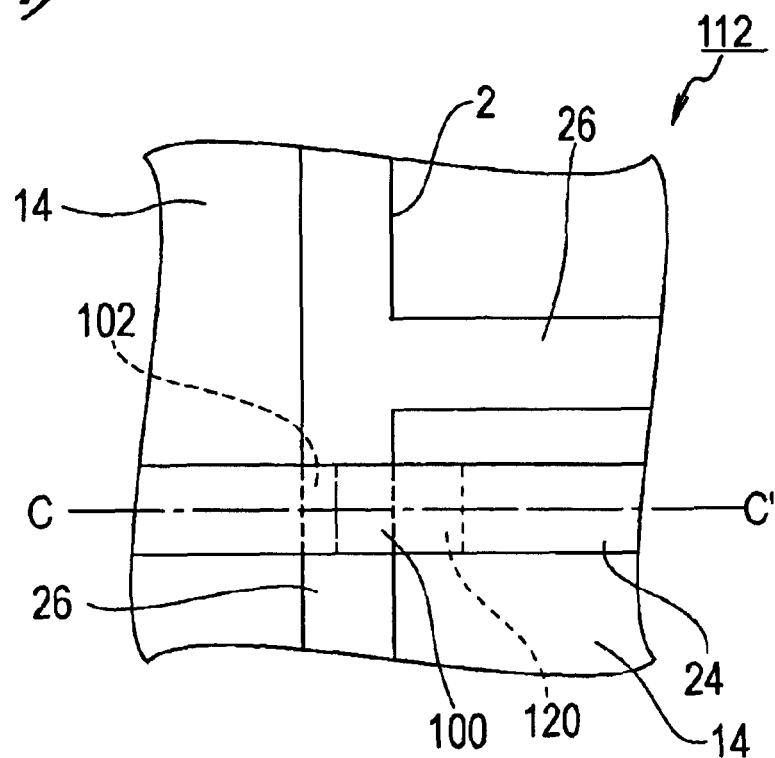
FIG. 2(A) is a plan view depicting the configuration of the memory cell region of the nonvolatile semiconductor memory device of the present invention.

FIG. 2(A) is a plan view depicting a part of the memory cell region 112 of the ROM, for example, including the nonvolatile semiconductor memory device 100, viewed from the top. In this FIG. 2(A), the positional relationship of a part of the composing elements of the nonvolatile semiconductor memory device 100 is shown. FIG. 2(A) is a plan view at a position corresponding to the above described FIG. 1(A). Therefore the composing elements of the memory cell region 112 are denoted with the same numerals as FIG. 1(A), for which redundant descriptions may be omitted.

Figure 2B:
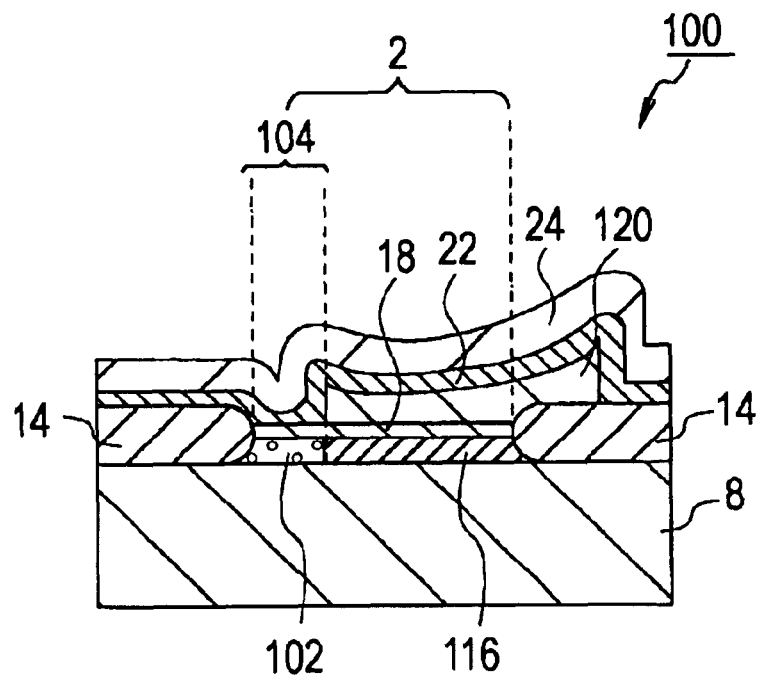
FIG. 2(B) is a cross-sectional view depicting the cutting plane for explaining the configuration of the nonvolatile semiconductor memory device.

FIG. 2(B) is a cross-sectional view corresponding to FIG. 1(B), depicting the cutting plane along the C–C' line in FIG. 2(A) for explaining the configuration of the nonvolatile semiconductor memory device 100. Therefore in the description of FIG. 2(B), composing elements similar to the nonvolatile semiconductor memory device 10, shown in FIG. 1(A), FIG. 1(B) and FIG. 1(C), are denoted with the same numerals as FIG. 1(A), FIG. 1(B) and FIG. 1(C), for which redundant descriptions may be omitted.

The configuration shown in FIG. 2(A) will be described first. In FIG. 2(A), the band-shape (rectangular) floating gate 120, which is the same shape as the floating gate 20 shown in FIG. 1(A), is disposed in the active region 2 of the memory cell region 112. And just like the configuration of the nonvolatile semiconductor memory device 10 described with reference to FIG. 1(A), the partial region where the floating gate 120 and the control gate 24 overlap with the active region 2 becomes the device region of the nonvolatile semiconductor memory device 100.

However, according to the configuration example of the nonvolatile semiconductor memory device 100 shown in FIG. 2(A), a region where the floating gate 120 is not formed exists in the active region 2, because of misalignment of the floating gate 120 and the active region 2. Outside the active region 2, a region where the floating gate 120 is not formed is a region where the active region 2 does not overlap with the floating gate 120, that is a non-overlapping region. Specifically, the floating gate 120 shown in FIG. 2(A) is formed from the active region 2 to a region other than the active region 2 so as to include a part of a region other than the active region 2 when the active region 2 is overlapped. Therefore according to the configuration shown in FIG. 2(A), the region where the active region 2 does not overlap with the floating gate 120 is a region where the floating gate 120 is not formed (non-overlapping region). According to the nonvolatile semiconductor memory device 100, a p-type high concentration diffused region 102, which is the first conductivity-type high concentration diffused layer region, is formed in the non-overlapping region of the floating gate 120.

Now a configuration example of the nonvolatile semiconductor memory device 100 will be described with reference to FIG. 2(B). According to this configuration example, the nonvolatile semiconductor memory device 100 is comprised of a p-type silicon (Si) substrate 8, that is a first conductivity-type semiconductor substrate where the active region 2 is created, a floating gate 120 formed on the p-type Si substrate 8, and a control gate 24 formed on the floating gate 120. As mentioned above, a region where the floating gate 120 is not overlapped, that is the non-overlapping region 104, exists in the active region 2 of the nonvolatile semiconductor memory device 100. Specifically, the floating gate 120 shown in FIG. 2(B) is formed from the active region 2 to a region outside the active region 2, extending to the p-type Si substrate 8 and a part of the field insulation film 14. In FIG. 2(B), a region where the floating gate 120 is not formed is shown in the active region 2 of the p-type Si substrate 8, that is the region surrounded by the field insulation film 14, is shown as the non-overlapping region 104 between the active region 2 and the floating gate 120. And according to the configuration example in FIG. 2(B), the p-type high concentration diffused region 102 is formed in the region where the floating gate 120 is not disposed on the p-type Si substrate 8 (non-overlapping region 104). And in the region of the p-type Si substrate 8, excluding the non-overlapping region 104 in the active region 2, the p-type diffused region 116, where the p-type channel ion has been implanted, is formed adjacent to the p-type high concentration diffused region 102. In the non-overlapping region 104 of the active region 2, the IPO film 22 and the control gate 24 are layered sequentially in this order.

When the p-type high concentration diffused region 102 is formed, the concentration of impurities included in the p-type high concentration diffused region 102 is adjusted. By this concentration adjustment, the threshold voltage Vt', to operate the nonvolatile semiconductor memory device 100 in the region where the floating gate 120 is not formed, that is the non-overlapping region 104, can be adjusted.

According to the nonvolatile semiconductor memory device 100, when the nonvolatile semiconductor memory device 100 is operated, the impurity concentration of the p-type high concentration diffused region 102 is adjusted so that the threshold voltage Vt' in the non-overlapping region 104 is higher than the threshold voltage Vt 10 in "0" state in the active region 2, excluding the non-overlapping region 104 with the floating gate.

Generally, the threshold voltage Vt of the nonvolatile semiconductor memory device differs depending on the status of the floating gate. Therefore data can be read from memory cells, including the nonvolatile semiconductor memory device, by the difference of the threshold voltage Vt of the nonvolatile semiconductor memory device.

For example, if a region where the floating gate is not overlapped is formed in the active region, the threshold voltage Vt of the nonvolatile semiconductor memory device becomes a constant at a low value in this non-overlapping region, so data cannot be read from the memory cells, including this nonvolatile semiconductor memory device. In other words, operation of the nonvolatile semiconductor memory device becomes abnormal.

According to the configuration of the nonvolatile semiconductor memory device 100, when data is read, the threshold voltage of the nonvolatile semiconductor memory device 100 is determined by the threshold voltage Vt1 in a region other than the non-overlapping region 104 where the floating gate does not exist in the active region 2, regardless the threshold voltage Vt' in the non-overlapping region 104.

Therefore the nonvolatile semiconductor memory device 100 of this invention operates normally even if the non-overlapping region 104 exists.

The configuration example of the nonvolatile semiconductor memory device 100 including the configuration of an n-channel type MOSFET, was described with reference to FIG. 2(A) and FIG. 2(B), but the nonvolatile semiconductor memory device 100 may be a device having the configuration of a p-channel type MOSFET. The nonvolatile semiconductor memory device 100, and the shape and positional relationship of each composing element of the memory cell region 112 including this nonvolatile semiconductor memory device 100, are merely examples, and are not limited by the above mentioned configuration example.

(2) Manufacturing Method of Nonvolatile Semiconductor Memory Device

FIG. 3(A) to FIG. 3(D), FIG. 4(A) to FIG. 4(D) and FIG. 5(A) to FIG. 5(D) show diagrams depicting the manufacturing steps used for the manufacturing method of the nonvolatile semiconductor memory device 10 comprising the configuration described with reference to FIG. 1(A), FIG. 1(B) and FIG. 1(C).

Referring to each of these diagrams which depict the manufacturing steps, the manufacturing method of the nonvolatile semiconductor memory device 10 will be described first.

In the descriptions herein below, specific materials and specific numerical conditions may be used, but these materials and conditions are merely one of the preferred embodiments, and therefore the invention shall not be limited by these in any way.

Figure 3A:
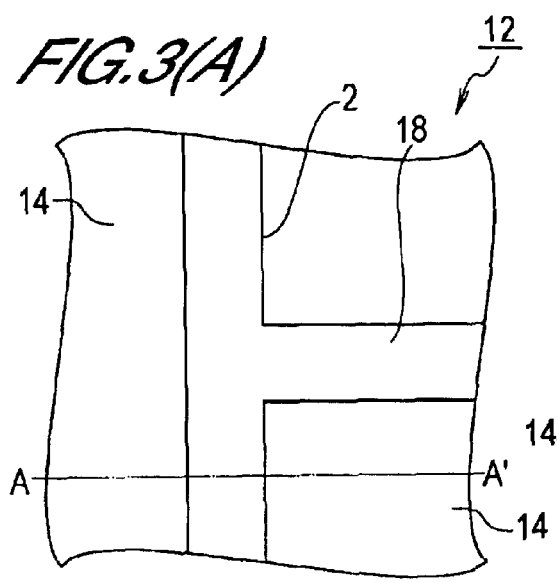
FIG. 3(A), FIG. 3(B), FIG. 3(C) and FIG. 3(D) are diagrams depicting the manufacturing steps for explaining the manufacturing method of the nonvolatile semiconductor memory device.
Figure 3B:
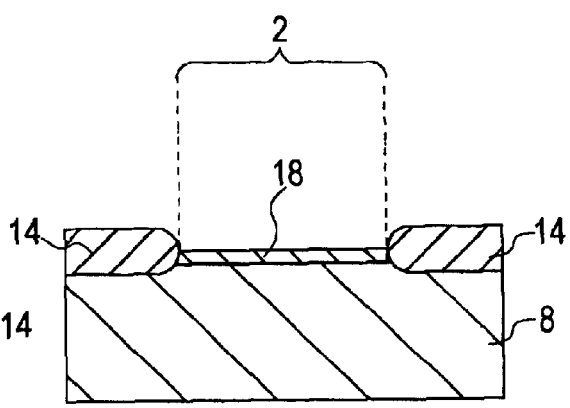
Figure 3C:
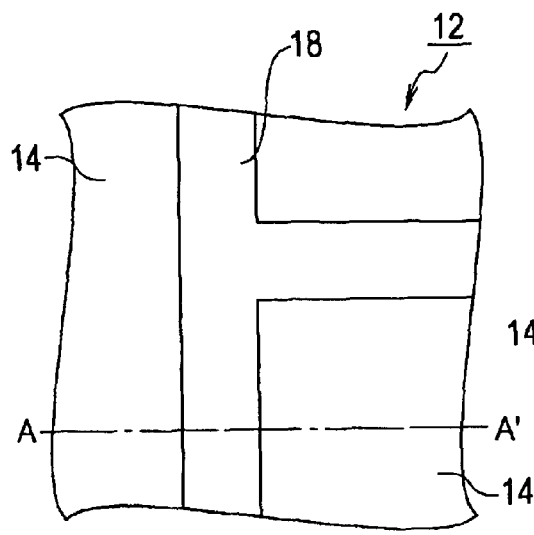
Figure 3D:
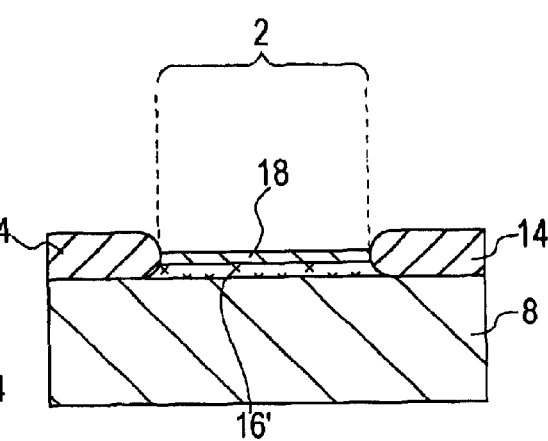

FIG. 3(A) and FIG. 3(C) are plan views depicting a part at the same position as FIG. 1(A). FIG. 3(B) and FIG. 3(D) are cross-sectional views depicting the cutting plane, the same as FIG. 1(B), and are diagrams for explaining the configuration of the memory cell region 12 in each step of the manufacturing method of the nonvolatile semiconductor memory device 10. FIG. 3(B) corresponds to FIG. 3(A). One step of the manufacturing steps of the nonvolatile semiconductor memory device 10 will now be described with reference to FIG. 3(A) and FIG. 3(B). FIG. 3(C) and FIG. 3(D) are also explanatory diagrams similar to the above mentioned FIG. 3(A) and FIG. 3(B). FIG. 4(A) to FIG. 4(D) and FIG. 5(A) to FIG. 5(D) are also explanatory diagrams having similar configurations as FIG. 3(A) to FIG. 3(D).

At first, the field insulation film 14 comprised of silicon oxide film ($SiO_2$ film) is formed on the Si substrate 8, where boron (B) is doped as the p-type impurity by a known LOCOS method, and the active region 2 surrounded by the field insulation film 14 is created. Then by a known thermal oxidation method, the gate insulation film 18 is formed on the active region 2 of the Si substrate 8 (FIG. 3(A) and FIG. 3(B)). In FIG. 3(A), the configuration of the gate insulation film 18 formed on the active region 2 of the memory cell region 12 is shown.

Then by a known ion implantation technology, boron (B), that is a p-type channel ion, is implanted as the impurity into the entire memory cell region 12 at about 30 KeV, $1.0 \times 10^{13}/cm^2$ (FIG. 3(D)). This boron, that is the impurity, is implanted for controlling the threshold voltage Vt of the nonvolatile semiconductor memory device 10. This boron is implanted only into the region 16' where a p-type diffused region is formed. As FIG. 3(D) shows, the area 16' where the p-type diffused region is formed is the same region as the p-type diffused region 16 shown in FIG. 1(B) and FIG. 1(C).

Figure 4A:
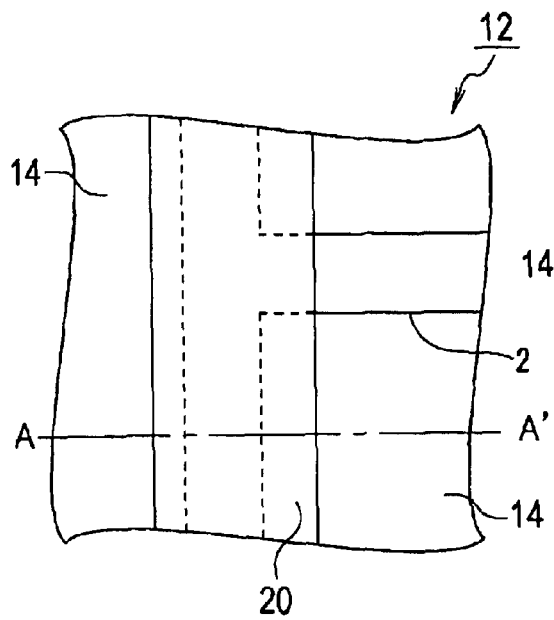
FIG. 4(A), FIG. 4(B), FIG. 4(C) and FIG. 4(D) are diagrams depicting the manufacturing steps for explaining the manufacturing method of the nonvolatile semiconductor memory device following FIG. 3.

Next the floating gate 20, which is configured using poly silicon containing $4.0 \times 10^{20}/cm^3$ phosphorus (P) as the n-type impurity, is formed on the gate insulation film 18 and the field insulation film 14 by an LP (Low Pressure) CVD (Chemical Vapor Deposition) method, then the floating gate 20 is patterned by a known photolithography technology and a known dry etching method. After this patterning, the floating gate 20 is formed in a linear (roughly rectangular) portion of the active region 2, to be a band-shape (rectangular) which includes the active region 2 and a part of a region other than the active region 2 (FIG. 4(A) and FIG. 4(B)). In FIG. 4(A), the positional relationship of the active region 2 and the floating gate 20, which is formed overlapping with the active region 2, is shown.

Figure 4B:
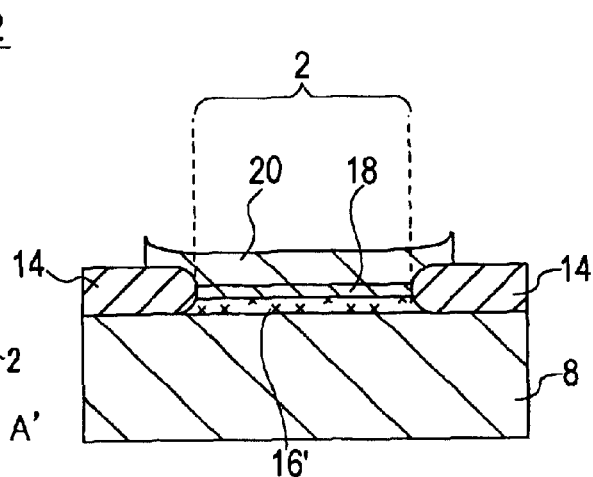
Figure 4C:
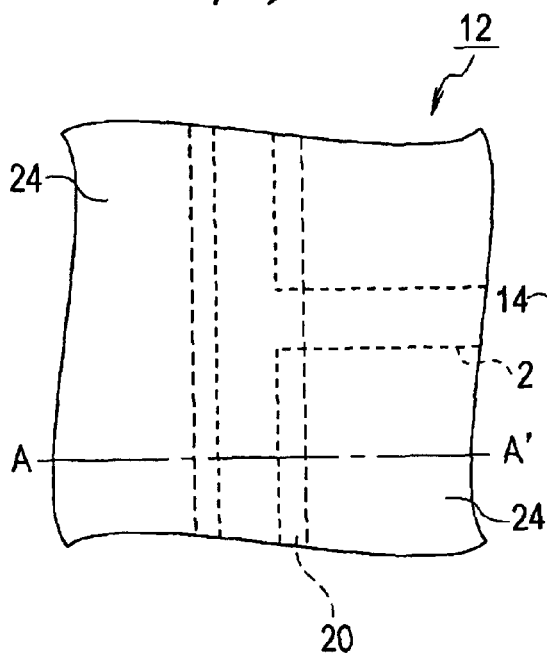
Figure 4D:
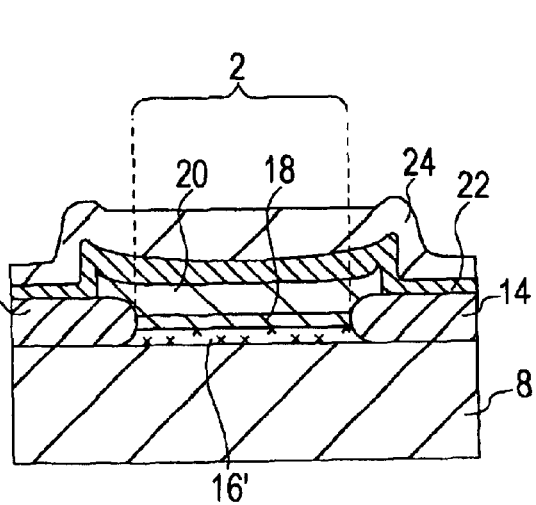

Then the IPO film 22 is formed on the floating gate 20 and the field insulation film 14 (FIG. 4(D)). This IPO film 22 is created as a layered film (ONO film) where the silicon nitride film (SiN film) is sandwiched by the two $SiO_2$ films. At first, a known thermal oxidation method is performed on the polysilicon, which is formed as the floating gate 20, as mentioned above, and the $SiO_2$ film is formed on the surface of this floating gate 20. On this $SiO_2$ film and the field insulation film 14, an SiN film is formed by an LPCVD method. Furthermore on this SiN film, a silicon oxide film ($SiO_2$ film) is formed by an LPCVD method, and as a result the IPO film 22 is formed.

Then the control gate 24 comprised of a high melting point metal polycide is formed on the IPO film 22 (FIG. 4(C) and FIG. 4(D)). This control gate 24 is formed by the following steps. At first, a polysilicon film, which contains about $6.0 \times 10^{20}/cm^3$ phosphorous (P) as the n-type impurity, is formed on the IPO film 22 by an LPCVD method. Then on this polysilicon, the high melting point metal silicide is layered by a CVD method. In this way, the control gate 24 of the high melting point metal polyside is formed.

By the steps described with reference to FIG. 4(C) and FIG. 4(D), the IPO film 22 and the control gate 24 are formed on the entire memory cell region 12. In FIG. 4(C), the positional relationship between the active region 2, the floating gate 20 and the control gate 24 is shown.

Figure 5A:
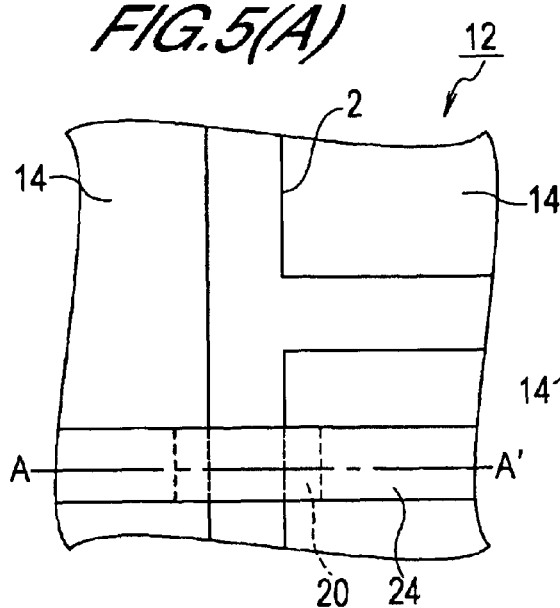
FIG. 5(A), FIG. 5(B), FIG. 5(C) and FIG. 5(D) are diagrams depicting the manufacturing steps for explaining the manufacturing method of the nonvolatile semiconductor memory device following FIG. 4.
Figure 5B:
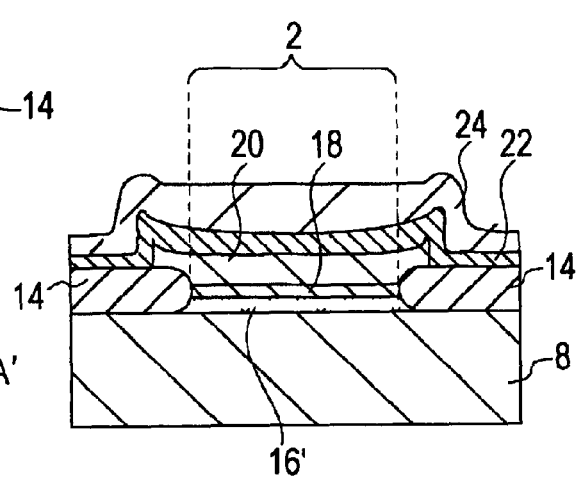

After this, the floating gate 20, the control gate 24, and the IPO film 22 are patterned by a known photolithography technology and a known dry etching method (FIG. 5(A) and FIG, 5(B)). In FIG. 5(A), the positional relationship between the active region 2, the floating gate 20 and the control gate 24 is shown. After the above mentioned patterning, the floating gate 20 and the control gate 24 are formed in a band-shape (rectangular) overlapping with the linear (rectangular) part region of the active region 2, so as to be perpendicular to the active region 2. The IPO film 22 and the control gate 24 stretch to the region outside the active region 2, extending over the region where the floating gate 20 is formed (FIG. 5(A)).

Figure 5C:
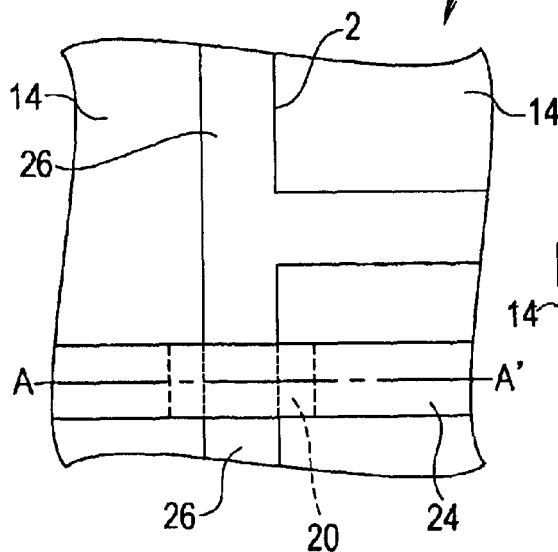
Figure 5D:
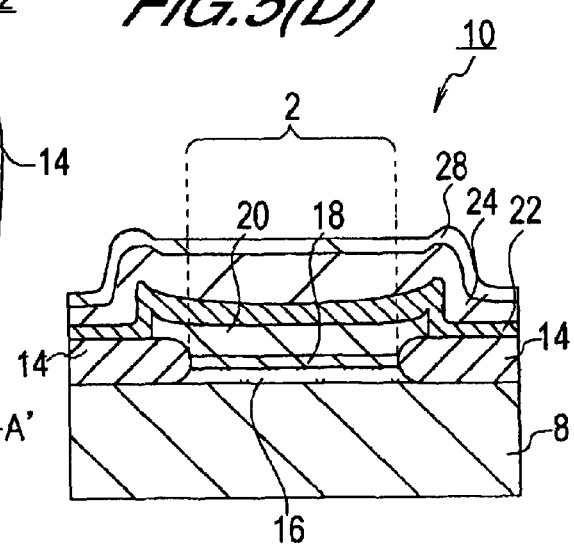

Then the mask oxide film 28 is formed on the surface of the control gate 24 by a known thermal oxide method. Then as an n-type impurity, arsenic (As) is implanted into the active region 2 so as to be about $1.0 \times 10^{15}/cm^2$ at 30 KeV by a known photolithography technology and a known ion implantation technology. After this, heat treatment is performed for 20 minutes at 900° C. in a nitrogen atmosphere, and an n-type high concentration diffused layer (second conductivity-type diffused region) 26, to be the source region and the drain region of the nonvolatile semiconductor memory device 10, is formed (FIG. 5(C)). FIG. 5(C) shows the positional relationship of the floating gate 20, the n-type high concentration diffused layer (second conductivity-type diffused region) 26, which is formed on the entire non-overlapping region of the active region 2, excluding the overlapping part between the control gate 24 and the active region 2 (in the memory cell region 12), the floating gate 20, and the control gate 24. According to the steps described with reference to FIG. 5(C) and FIG. 5(D), the n-type high concentration diffused layer 26 is not formed on the control gate 24 and the part of the active region, which overlaps with the control gate 24. Also the p-type diffused region 16 is formed (FIG. 5(D)) after the heat treatment step, described with reference to FIG. 5(C) and FIG. 5(D).

Figure 6A:
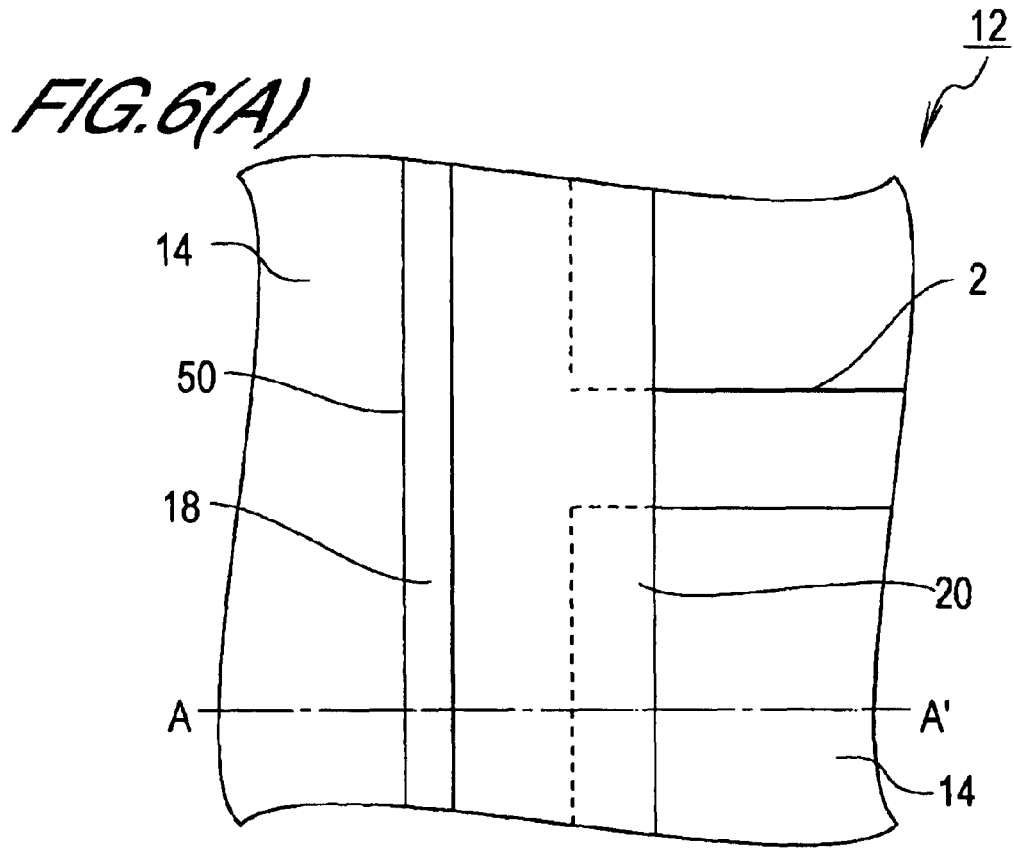
FIG. 6(A) and FIG. 6(B) are diagrams depicting the manufacturing steps for explaining the manufacturing method of the nonvolatile semiconductor memory deice following FIG. 5.
Figure 6B:
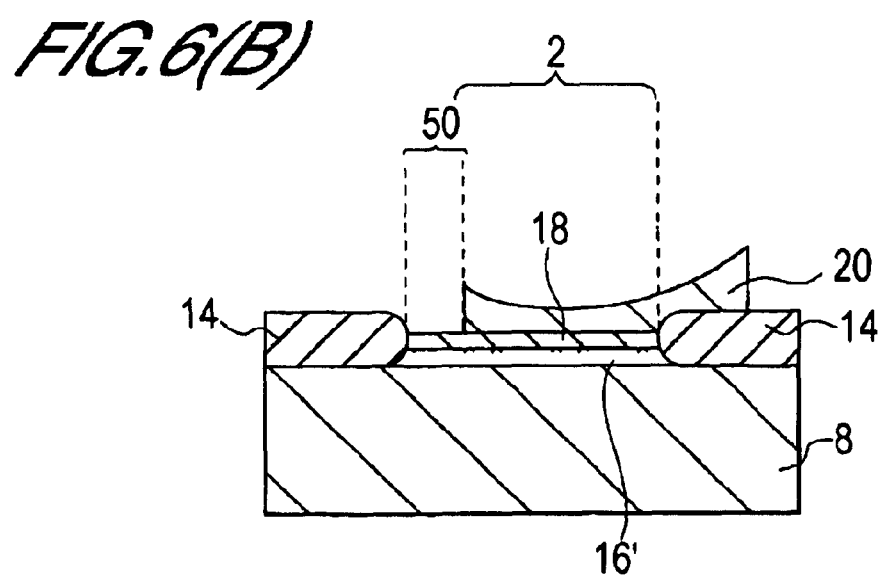

In the steps described with reference to FIG. 4(A) and FIG. 4(B), when the floating gate 20 is patterned by a known photolithography technology, a region where the floating gate 20 is overlapped may be created in the device region of the nonvolatile semiconductor memory device 10 in the active region 2 described with reference to FIG. 1(A) due to the misalignment of the resist pattern. FIG. 6(A) shows the configuration of the memory cell region 12 when the region where the floating gate 20 is not overlapped is formed, and FIG. 6(B) shows the configuration of the device region of the nonvolatile semiconductor memory device 10 in the active region 2. FIG. 6(A) is a plan view depicting a part of the region at the same position as FIG. 4(A), and FIG. 6(B) is a cross-sectional view depicting the cutting plane corresponding to FIG. 4(B).

According to the configuration shown in FIG. 6(A), the floating gate 20 is formed at a position which deviates from the original formation position of the floating gate 20 in the linear portion (rectangular) region in the active region 2. In the device region of the nonvolatile semiconductor memory device 10, the region 50 where the floating gate is not overlapped is formed in the active region 2, that is the above p-type diffused region.

For example, if a region where the floating gate is not overlapped is formed in the active region, the threshold voltage Vt of the nonvolatile semiconductor memory device becomes constant at a low value in this non-overlapping region, so data cannot be read from the memory cells, including the nonvolatile semiconductor memory device. In other words, operation of the nonvolatile semiconductor memory device becomes abnormal.

Figure 7A:
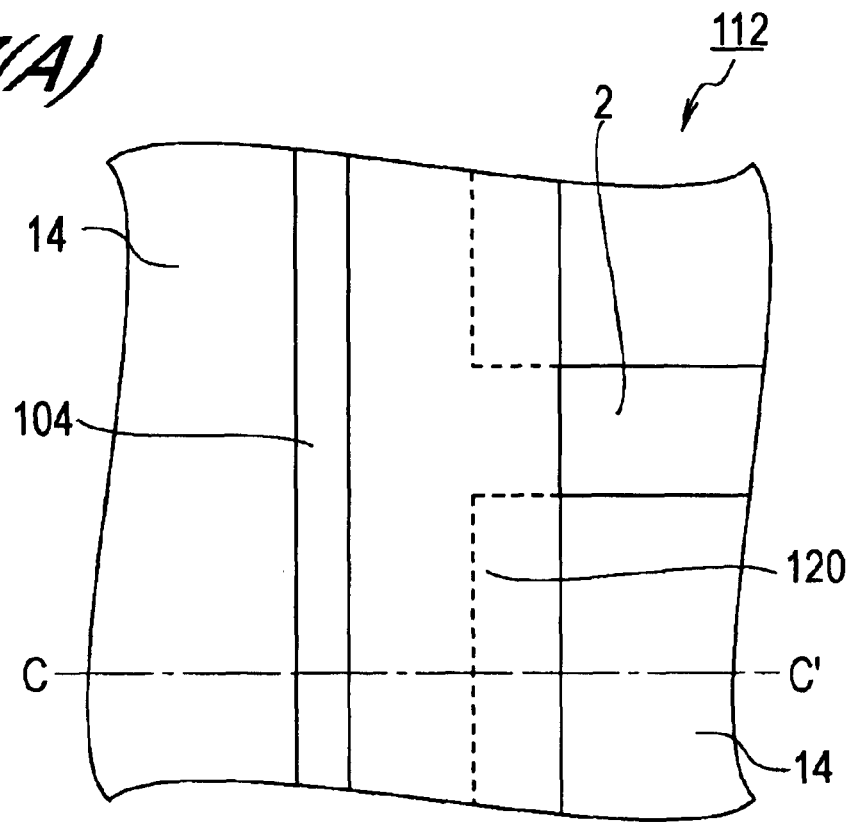
FIG. 7(A) and FIG. 7(B) are diagrams depicting the manufacturing steps for explaining the manufacturing method of the nonvolatile semiconductor memory device of the invention.
Figure 7B:
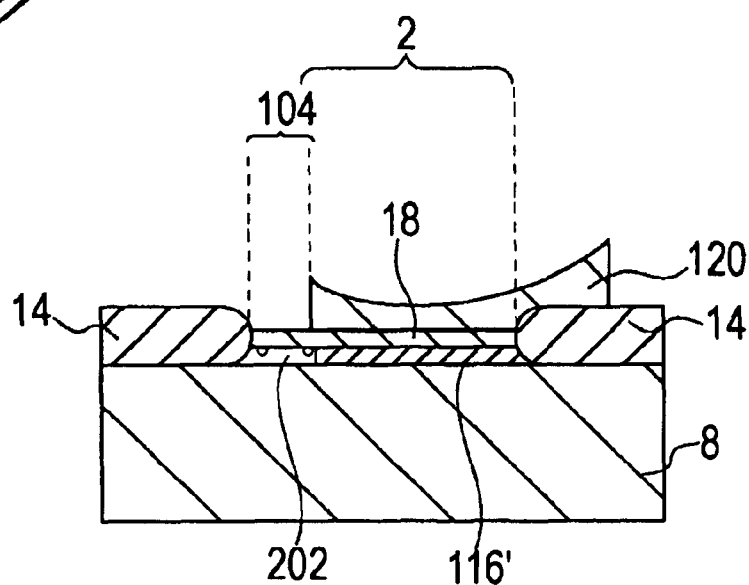

Now a manufacturing method of the nonvolatile semiconductor memory device 100, which was described with reference to FIG. 2(A) and FIG. 2(B), will be described. FIG. 7(A) and FIG. 7(B) are diagrams depicting the manufacturing steps used for explaining the manufacturing method of the nonvolatile semiconductor memory device 100 of the invention. FIG. 7(A) is a plan view depicting a partial region at a position the same as FIG. 2(A). FIG. 7(B) is a cross-sectional view depicting the cutting plane at a position the same as FIG. 2(B), and is for describing the configuration of the memory cell region 112 in one step of the manufacturing method of the nonvolatile semiconductor memory device 100.

It is preferable that the nonvolatile semiconductor memory device 100 of this embodiment is manufactured by the steps which are the same as the manufacturing method of the nonvolatile semiconductor memory device 10, which was described above with reference to FIG. 3(A)–FIG. 5(D). Therefore for the steps which are the same as the manufacturing method of the nonvolatile semiconductor memory device 10 described above with reference to FIG. 3(A) to FIG. 5(D), detailed descriptions thereof may be omitted.

The case when the nonvolatile semiconductor memory device 100 is manufactured using the same materials and conditions as the manufacturing method of the nonvolatile semiconductor memory device 10 described above with reference to FIG. 3(A) to FIG. 5(D) will now be described.

In the nonvolatile semiconductor memory device 100, the field insulation film 14 and the gate insulation film 18 are formed on the p-type Si substrate 8, preferably by steps which are the same as each step described above with reference to FIG. 5, and a p-type channel ion is implanted. Here the region where the p-type channel ion is implanted is preferably a region which is the same as the region described above with reference to FIG. 3(C) and FIG. 3(D).

Then it is preferable that the floating gate 120 is formed in the same way as the steps described above with reference to FIG. 4(A) and FIG. 4(B). Here when the floating gate 120 is patterned, the floating gate 120 is formed in the linear (rectangular) part (region) of the active region 2 and in a region which includes a part of a region other than the active region 2, along the linear (rectangular) part of this active region 2, using a resist pattern (not illustrated) as described with reference to FIG. 4(A) and FIG. 4(B).

However if the floating gate 120 is formed in a region other than the linear (rectangular) part (region) of the active region 2 and in a region which includes a part of a region other than the active region 2, along the linear (rectangular) part of this active region 2 due to misalignment of the resist pattern and active region 2, then a region where the floating gate 120 is not formed, that is a non-overlapping region, is generated in the active region 2.

FIG. 7(A) and FIG. 7(B) show the configuration of the floating gate 120 where misalignment with the active region 2 occurred as a result of the above mentioned misalignment of the resist pattern. In FIG. 7(A), the floating gate 120 is formed in a band-shape (rectangular) in the linear (roughly rectangular) part of the active region 2, extending from the active region 2 to a region other than the active region 2, so as to include a part of a region other than the active region 2.

FIG. 7(B) is a diagram depicting the part cutting the memory cell region 112 shown in FIG. 7(A) by the C–C' line in FIG. 7(A). According to the configuration example shown in FIG. 7(B), the floating gate 120 is formed, from the active region 2 to a region other than the active region 2, in the region above the field insulation film 14. Therefore in FIG. 7(B), a region where the floating gate is not formed, that is the non-overlapping region 104, exists in the active region 2.

According to the manufacturing method of the nonvolatile semiconductor memory device of the invention, the floating gate 120 is formed by the above mentioned steps, then using this floating gate 120 as a mask, $1.0 \times 10^{14}/cm^2$ of boron (B) is implanted at 10 keV into the entire memory cell region as a p-type impurity by a known ion implantation technology (FIG. 7(A) and FIG. 7(B)).

If the p-type impurity is implanted into the entire memory cell region 112 after forming the floating gate 120, as mentioned above, this floating gate 120 becomes a mask, and the p-type impurity is implanted into a region of the p-type Si substrate 8 in a region where the active region 2 and the floating gate 120 are not overlapped, that is the non-overlapping region 104 of the active region 2, in a self aligning way. As described above, a p-type channel ion has been implanted into the active region 2 in advance, so if a p-type impurity is implanted by the above mentioned steps after the floating gate 120 is formed, the region where the p-type impurity is implanted becomes a double ion implanted region 202 (FIG. 7(A) and FIG. 7(B)). As FIG. 7(B) shows, the double ion implanted region 202, where the p-type impurity concentration is high, is formed in the non-overlapping region 104 of the floating gate on the p-type Si substrate 8 of the active region 2, and the p-type diffused region formation region 116' is formed at a location adjacent to this region 202.

Then it is preferable to form the nonvolatile semiconductor memory device 100 by steps which are the same steps described above with reference to FIG. 4(C) and FIG. 4(D), and FIG. 5(A) to FIG. 5(D). After the steps described with reference to FIG. 5(A) to FIG. 5(D), the p-type high concentration diffused region 102 is formed in a region which is the same as the double ion implanted region 202 in the active region 2 on the p-type Si substrate 8, and the p-type diffused region (first conductivity-type diffused layer) 116 is formed in a region which is the same as the region 116' where p-type diffused region is formed.

When the p-type impurity is implanted in the steps described with reference to FIG. 7(A) and FIG. 7(B), it is preferable that the threshold voltage Vt' in the non-overlapping region 104, between the active region and the floating gate when the nonvolatile semiconductor memory device 100 is operating, is adjusted by adjusting the implantation amount.

The implantation amount of the p-type impurity is adjusted such that the threshold voltage Vt' in the non-overlapping region 104 becomes higher than the threshold voltage Vt 10 in the "0" state in the active region 2, excluding the non-overlapping region 104, when the nonvolatile semiconductor memory device 100 is operating.

When the n-type high concentration diffused layer (second conductivity-type diffused region) 26 is formed, it is preferable to set the impurity concentration of the diffused layer 26 to be sufficiently higher than the impurity concentration of the p-type high concentration diffused region (first conductivity-type high concentration diffused region) 102.

The differences in operation of the memory cells, which includes the nonvolatile semiconductor memory device 100 manufactured by the above mentioned steps, between the case when the p-type high concentration diffused region 102 is formed in the non-overlapping region 104 and the case when the p-type high concentration diffused region 102 is not formed in the non-overlapping region 104, will now be described with reference to Table 1.

Table 1 is a table used for explaining the expected threshold voltage and operation of the memory cells. Table 1 shows the threshold voltage in each region of the active region 2 of the nonvolatile semiconductor memory device 100 and the operation of the memory cells for the configuration examples in the case of when the p-type high concentration diffused region 102 is formed in the nonvolatile semiconductor memory device 100, and in the case when the p-type high concentration diffused region 102 is not formed respectively.

TABLE 1

Operation of nonvolatile semiconductor memory device

|  | When p-type high concentration diffused region is formed | When p-type high concentration diffused region is not formed |
|---|---|---|
| Relationship between active region and floating gate of nonvolatile memory device (region) | Threshold voltage | Threshold voltage |
| Non-overlapping (region) | Normal or high | Low |
| Overlapping (region) | Normal | Normal |
| Operation of memory cell | Normal | Does not operate |

When the p-type high concentration diffused region 102 is formed in the nonvolatile semiconductor memory device 100, the threshold voltage Vt' in the non-overlapping region 104 between the active region 2 and the floating gate of the nonvolatile semiconductor memory device 100 becomes either normal or high. At this time, the threshold voltage Vt 1 in a region of the active region 2, other than the non-overlapping region 104, that is the overlapping region between the active region 2 and the floating gate 120, becomes normal. As a result, the threshold voltage of the nonvolatile semiconductor memory device 100 in this case is determined by the threshold voltage Vt 1 in the overlapping region between the active region 2 and the floating gate 120, so the threshold voltage of the memory cells, including this nonvolatile semiconductor memory device 100, also becomes normal.

When the p-type high concentration diffused region 102 is not formed in the nonvolatile semiconductor memory device 100, the threshold voltage Vt 1 in the overlapping region between the active region 2 of the nonvolatile semiconductor memory device 100 and the floating gate 120 is normal, but the threshold voltage Vt' in the non-overlapping region 104 in the active region 2 becomes low. As a result, the threshold voltage of the nonvolatile semiconductor memory device 100 in this case is influenced by the threshold voltage Vt' in the non-overlapping region 104 of the floating gate. Therefore the threshold voltage of the memory cells, including this nonvolatile semiconductor memory device 100, becomes low, and as a result, operation becomes abnormal.

According to the configuration example of the nonvolatile semiconductor memory device of the invention, the threshold voltage of the first conductivity-type high concentration diffused region becomes higher than the threshold voltage when a region other than the first conductivity-type high concentration diffused region is "0" state. Therefore when data is read, the threshold voltage of the nonvolatile semiconductor memory device of the invention is determined by the threshold voltage in a region other than the non-overlapping region between the active region and the floating gate in the active region, regardless the threshold voltage in the first conductivity-type high concentration diffused region, that is the threshold voltage of the non-overlapping region between the active region and the floating gate in the active region. As a result, the nonvolatile semiconductor memory device of the present invention operates normally, even if a non-overlapping region between the active region and the floating gate exists in the active region.

(Addition)

In an embodiment of the invention, the preferred manufacturing method of the nonvolatile semiconductor memory includes the following steps.

The manufacturing method comprises forming the field insulation film for creating the active region on the first conductivity-type semiconductor substrate, forming the floating gate on the first conductivity-type semiconductor substrate, forming the first conductivity-type high concentration diffused region by implanting a first conductivity-type impurity into the non-overlapping region with the floating gate in the active region at high concentration, and forming the control gate on the floating gate.

At this time, it is preferable that the impurity concentration of the first conductivity-type high concentration diffused region is adjusted such that the threshold voltage of the non-overlapping region becomes the same as the threshold voltage of the overlapping region with the floating gate.

It is also preferable that the impurity concentration of the first conductivity-type high concentration diffused region is adjusted such that the threshold voltage of the non-overlapping region becomes higher than the threshold voltage in the overlapping region with the floating gate.

What is claimed is:

1. A nonvolatile semiconductor memory device, comprising:
   a first conductivity-type semiconductor substrate where an active region is created;
   a floating gate which is formed over said active region; and
   a control gate which is formed over said floating gate,
   the active region including a first conductivity-type diffused region of a first impurity concentration formed where said floating gate overlaps above the active region, and a first conductivity-type high concentration diffused region of a second impurity concentration that is greater than the first impurity concentration formed where said floating gate does not overlap above the active region.

2. The nonvolatile semiconductor memory device according to claim 1, wherein the second impurity concentration is a concentration whereby a threshold voltage of the active region that said floating gate does not overlap is equivalent to a threshold voltage of the active region that said floating gate overlaps.

3. The nonvolatile semiconductor memory device according to claim 1, wherein the second impurity concentration is a concentration whereby a threshold voltage of the active region that said floating gate does not overlap is higher than a threshold voltage of the active region that said floating gate overlaps.

4. A nonvolatile semiconductor memory device, comprising:
   a first conductivity-type semiconductor substrate;
   a field insulation film which is formed on said first conductivity-type semiconductor substrate;
   a first conductivity-type diffused region which is formed in an active region surrounded by said field insulation film;

a first conductivity-type high concentration diffused region which is formed at a location adjacent to said first conductivity-type diffused region in said active region surrounded by the field insulation film;

a gate insulation film which is formed on said first conductivity-type diffused region and said first conductivity-type high concentration diffused region;

a floating gate which is formed stretching from a region above said gate insulation film, corresponding to a region above said first conductivity-type diffused region, to said field insulation film;

an IPO film which is formed on said field insulation film, said floating gate and said gate insulation film;

a control gate which is formed on said IPO film; and a second conductivity-type diffused region which is formed in the active region where said floating gate and said control gate do not exist.

5. The nonvolatile semiconductor memory device according to claim 4, wherein an impurity concentration of said first conductivity-type high concentration diffused region is higher than a concentration of said first conductivity-type diffused region.

6. The nonvolatile semiconductor memory device according to claim 4, wherein an impurity concentration of said first conductivity-type high concentration diffused region is a concentration whereby a threshold voltage of said first conductivity-type high concentration diffused region becomes equivalent to a threshold voltage of said first conductivity-type diffused region.

7. The nonvolatile semiconductor memory device according to claim 4, wherein an impurity concentration of said first conductivity-type high concentration diffused region is a concentration whereby a threshold voltage of said first conductivity-type high concentration diffused region becomes higher than a threshold voltage of said first conductivity-type diffused region.

8. The nonvolatile semiconductor memory device according to claim 4, wherein an impurity concentration of said second conductivity-type diffused region is a concentration higher than an impurity concentration of said first conductivity-type high concentration diffused region.

9. The nonvolatile semiconductor memory device according to claim 4, wherein said IPO film is a layered film having an $SiO_2$ film, an SiN film and an $SiO_2$ film layered sequentially in order.

10. The nonvolatile semiconductor memory device according to claim 4, wherein said first conductivity-type high concentration diffused region is formed in a region where said floating gate is not created because a formation position of said floating gate is misaligned, and also in a region adjacent to said first conductivity-type diffused region.

* * * * *